United States Patent [19]
Goldblum

[11] Patent Number: 5,530,412
[45] Date of Patent: Jun. 25, 1996

[54] ENHANCED MODE STIRRED TEST CHAMBER

[75] Inventor: Charles E. Goldblum, West Conshohocken, Pa.

[73] Assignee: EMC Science Center, Inc., West Conshohocken, Pa.

[21] Appl. No.: 116,934

[22] Filed: Sep. 3, 1993

[51] Int. Cl.$^6$ ........................................... H01P 7/06
[52] U.S. Cl. .................... 333/232; 324/633; 455/67.2
[58] Field of Search .................... 333/208, 209, 333/212, 227–232; 324/633–636, 627; 455/67.2

[56] References Cited

U.S. PATENT DOCUMENTS

| | | | |
|---|---|---|---|
| H821 | 9/1990 | Hatfield et al. | 324/627 |
| 2,605,459 | 7/1952 | Cook | 333/228 |
| 2,913,577 | 11/1959 | Johnson | 455/269 |
| 3,100,870 | 9/1963 | Smith | 455/67.2 |
| 3,113,271 | 12/1963 | Buckley | 455/67.2 |
| 3,120,641 | 2/1964 | Buckley | 455/67.2 |
| 3,158,825 | 11/1964 | Vetter | 333/232 |
| 3,365,667 | 1/1968 | Deutsch et al. | 455/67.2 |
| 3,458,808 | 7/1969 | Agdur | 324/636 X |
| 4,004,227 | 1/1977 | Ikrath | 455/67.2 |
| 4,249,148 | 2/1981 | Jachowski | 333/208 |
| 4,278,933 | 7/1981 | Klopach et al. | 324/627 |
| 4,644,303 | 2/1987 | Jachowski et al. | 333/230 X |
| 4,721,933 | 1/1988 | Schwartz et al. | 333/212 |
| 4,726,071 | 2/1988 | Jachowski | 333/231 X |
| 4,733,165 | 3/1988 | Richardson et al. | 324/636 |
| 4,885,527 | 12/1989 | Lacombe et al. | 324/636 |
| 4,939,446 | 7/1990 | Rogers | 324/72 |
| 5,134,405 | 7/1992 | Ishihara et al. | 342/1 |
| 5,237,283 | 7/1993 | Carbonini | 324/627 |
| 5,398,009 | 3/1995 | Kudo et al. | 333/208 |

*Primary Examiner*—Benny T. Lee
*Assistant Examiner*—Justin P. Bettendorf
*Attorney, Agent, or Firm*—Frank M. Linguiti; Reed Smith Shaw & McClay

[57] ABSTRACT

A system and method is provided for transmitting input energy in an electromagnetic field test chamber having a predetermined fundamental frequency $f_0$ determined by the dimensions of the chamber. The test chamber has an electromagnetic shield for preventing external electromagnetic fields from being applied to the interior of the chamber. A tuner is provided for modifying the impedance of the chamber and a rod is provided for establishing new boundary conditions for the electromagnetic energy. Energy is applied to the chamber at a frequency equal to a subharmonic frequency $f_S$ wherein $f_S < f_0$ and a gain is applied to the input energy by the test chamber. The resonance of the chamber is tuned by adjusting the rod. Energy may be applied to the test chamber at a plurality of frequencies in the vicinity of the subharmonic frequency, creating a corresponding plurality of gains. A peak gain is provided at the subharmonic frequency. Adjusting the rods may be accomplished by adjusting the rod diameter, the length, or position of the rod. The number of rods may also be adjusted. The ends of the rods may be electrically coupled or decoupled to the test chamber walls.

29 Claims, 6 Drawing Sheets

ENHANCED MODE STIRRED TEST CHAMBER

FIELD OF THE INVENTION

The present invention relates to the field of electromagnetic field test chambers, and, in particular, to an enhanced mode stirred electromagnetic field test chamber.

BACKGROUND OF THE INVENTION

Many environments have high levels of electromagnetic radiation due to a concentration of transmitting devices. Additionally, other types of electrical equipment generate leakage of electromagnetic radiation when they operate even though it is not their function to transmit radiation. Unwanted radiation from sources such as these may interfere with the operation of many pieces of electrical equipment. It is thus important to test electrical equipment to determine how well it operates when it is subjected to unwanted electromagnetic radiation.

Electromagnetic field test chambers were developed to provide shielding from external electromagnetic radiation as well as to provide an environment in which standardized electromagnetic radiation test procedures could be developed for many types of radiation sources. In order to determine the susceptibility of a device to radiation using these test chambers the device must be subjected to the radiation frequencies and field strengths which are representative of the environment in which it will operate. It is desirable that the fields used to test a device in this manner be statistically representative of the electromagnetic environment so that the level of radiation to which the device is subject can be accurately determined.

Several types of electromagnetic field chambers which may be used for these purposes are known. For example, test chambers having parallel plates and biconical antennas were commonly used in the high frequency band. Although the parallel plates used in these test chambers allowed for adequate field strengths, the wave impedance of the test fields provided was three hundred seventy-seven ohms. This was not representative of the wave impedances experienced in many actual device operating environments.

Anechoic test chambers were also known. The chambers are provided with a large number of cones on the walls, floor, and ceiling to minimize reflected energy. These anechoic test chambers tended to be very expensive and did not adequately represent the wave impedance found in many real life situations. Furthermore, at very high field strengths anechoic chambers had problems with power absorption and heat dissipation.

Mode stirred test chambers are another type of test chamber known in the art of electromagnetic field testing. A mode stirred chamber was a modified shielded room that ranged in size from small metal enclosures having a size of approximately two cubic meters to large shielded rooms. The distinguishing feature of the prior art mode stirred chambers was a paddle wheel tuner. These tuners were relatively large field-perturbing devices which were shaped like a paddle wheel and rotated within the test chamber. This irregularly shaped 10 metal structure caused large changes in the standing wave patterns within the mode stirred test chamber as it was rotated. In this way, the many simultaneously existing modes were "stirred" as described in "Evaluation and Use of a Reverberation Chamber for Performing Electromagnetic Susceptibility Vulnerability Measurements" by M. L. Crawford and G. H. Koepke in the National Bureau of Standards Technical Note 1092, April 1986.

Shielding effectiveness methods using the mode-stirred chamber were easy to perform and repeatable. The traditional approach, referred to as the discrete frequency method, involved testing one frequency at a time. In this method energy was concentrated at discrete frequencies thereby yielding extremely accurate data. However, testing time using this method was as long as forty minutes per frequency.

As is also true with other prior art test chambers, mode stirred test chambers were required to have dimensions equal to the wavelengths of the electromagnetic energy applied during the test in order for them to resonate at the test frequency. Therefore, tests performed using these mode stirred test chambers were limited to rather high frequency, short wavelength energy. Otherwise the size of the test chambers would be prohibitively large. A need therefore existed for test chambers which could be used to test 10 electrical equipment at low frequencies wherein the wavelength may be several hundred yards, thereby making it unfeasible to build traditional mode stirred test chambers large enough.

The mode stirred chamber of the present invention can be used to test electronic equipment in the range from 200 MHz to 40 GHz in the manner commonly used in the prior art stirred mode test chambers. However the stirred chamber of the present invention is also effective to test electronic equipment using high frequency near fields. Thus it is effective to generate near field impedance high frequency fields as well as far field impedance in the microwave region. This feature is provided by disposing at least one conductive metal rod, and preferably a plurality of such rods, between opposing walls of the test chamber. The conductive rod receives radio frequency energy applied to the test chamber and reradiates the received energy due to currents induced in the rods by the applied energy. When the rods are electrically coupled to the opposing walls they effectively form an equivalent loop antenna with the adjacent walls and reradiate magnetic fields within the test chamber in a manner known with respect to loop antennas. When the rods are insulated from one wall they reradiate electric fields in a manner known with respect to conventional whip antennas. When the electronic equipment under test is placed near the equivalent loop antenna the low magnitude wave impedance associated with its nearness to a magnetic field antenna is applied to the electronic equipment under test. Furthermore, when the electronic equipment under test is placed near the equivalent whip antenna the high magnitude impedance electric field associated with an antenna is applied to the equipment under test.

SUMMARY OF THE INVENTION

A system and method is provided for transmitting input energy in an electromagnetic field test chamber having a predetermined fundamental frequency $f_0$ determined by the dimensions of the chamber. The test chamber has an electromagnetic shield for preventing external electromagnetic fields from being applied to the interior of the chamber. A first or transmitting antenna applies energy to the chamber and a second or receiving antenna receives the energy. A tuner is provided for modifying the impedance of the chamber and a rod is provided for establishing new boundary conditions for the electromagnetic energy. Energy is applied to the chamber at a frequency equal to a first subharmonic frequency $f_S$ wherein $f_S<f_0$ and a gain is applied to the input energy by the test chamber. The resonance of the chamber is tuned by adjusting the rod.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings.

DETAILED DESCRIPTION OF PREFERRED EMBODIMENTS

Figure 1A:
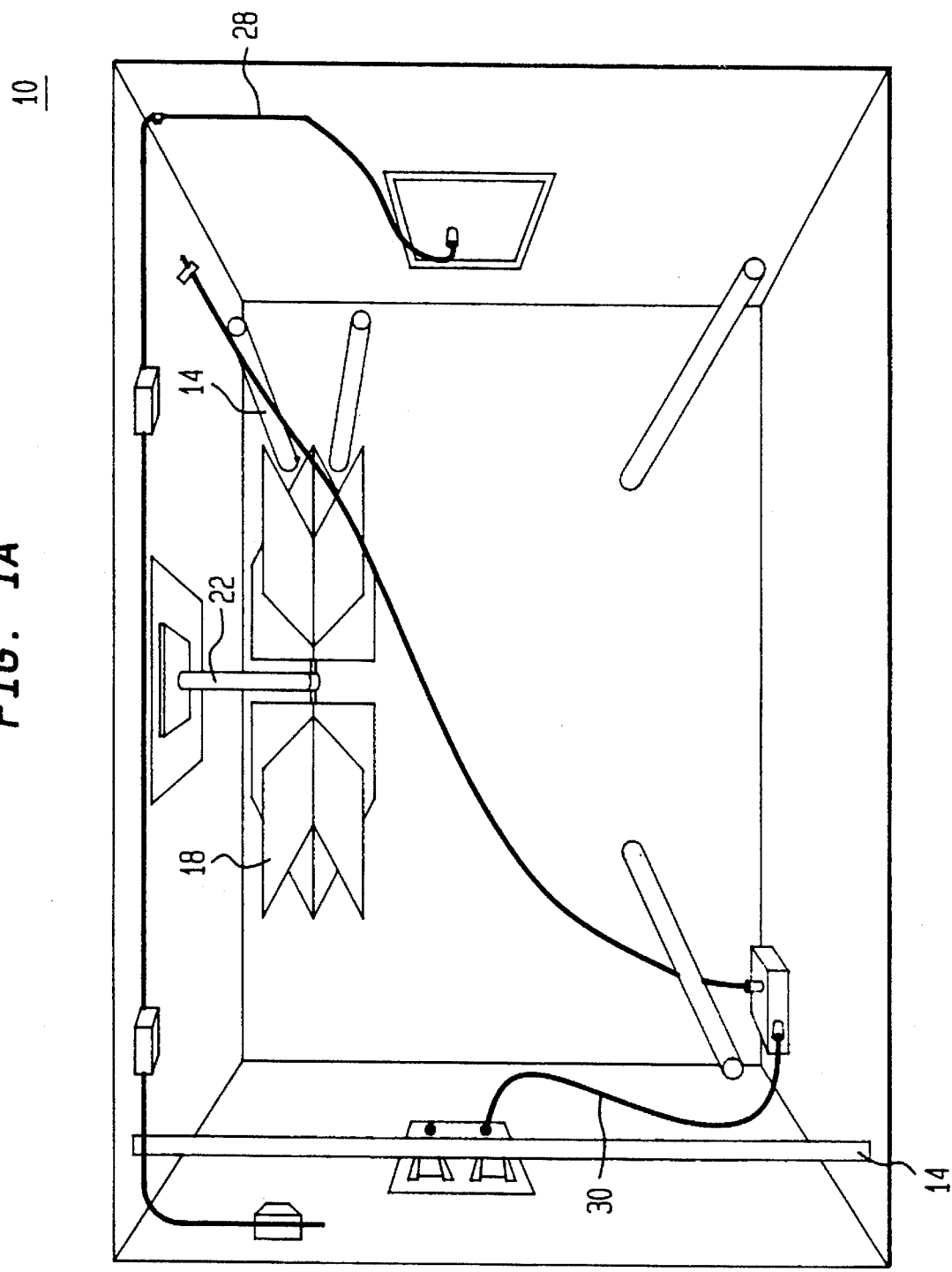
FIGS. 1A, B are a schematic perspective views of a subharmonic frequency electromagnetic field test chamber in accordance with a preferred embodiment of the present invention.
Figure 1B:
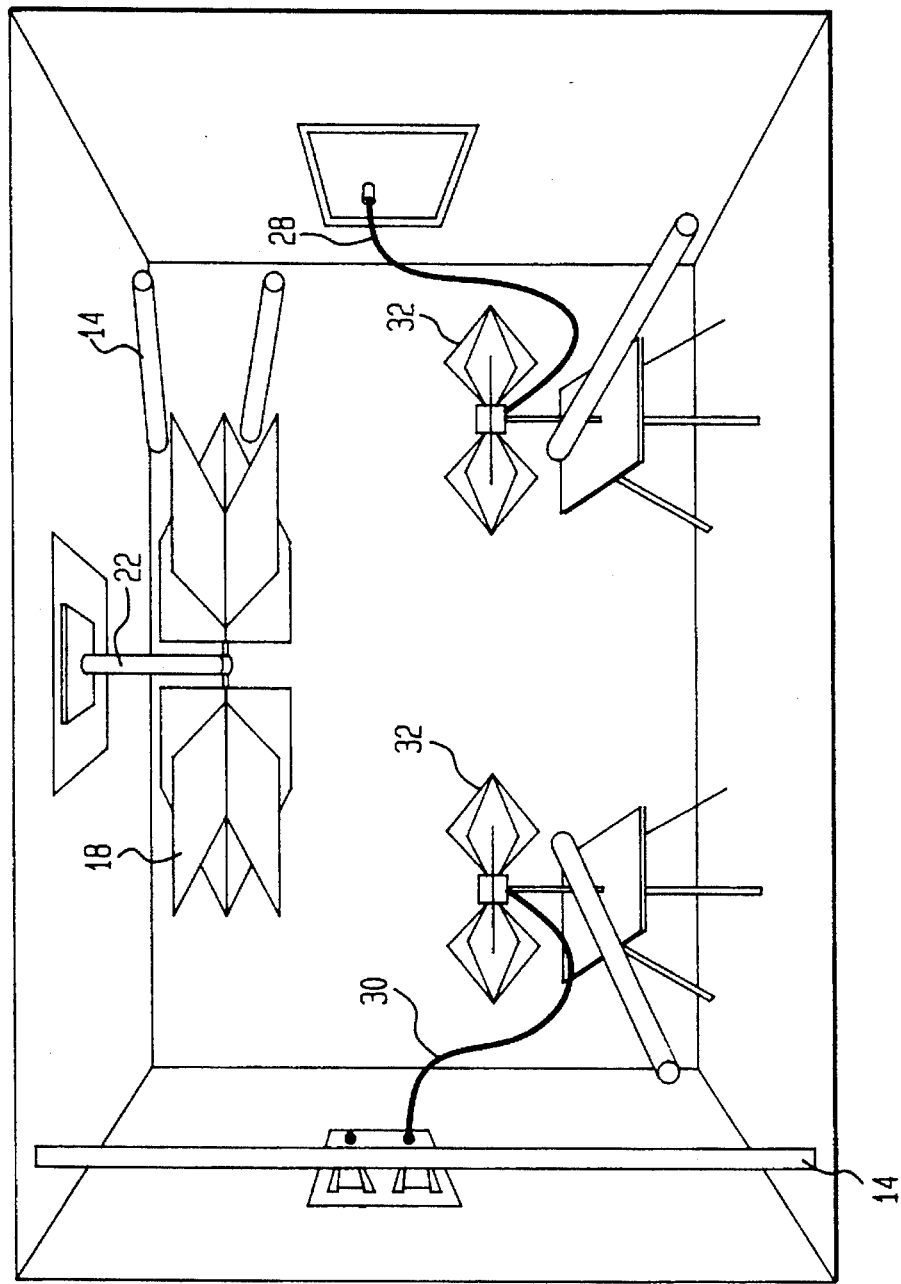
Figure 2:
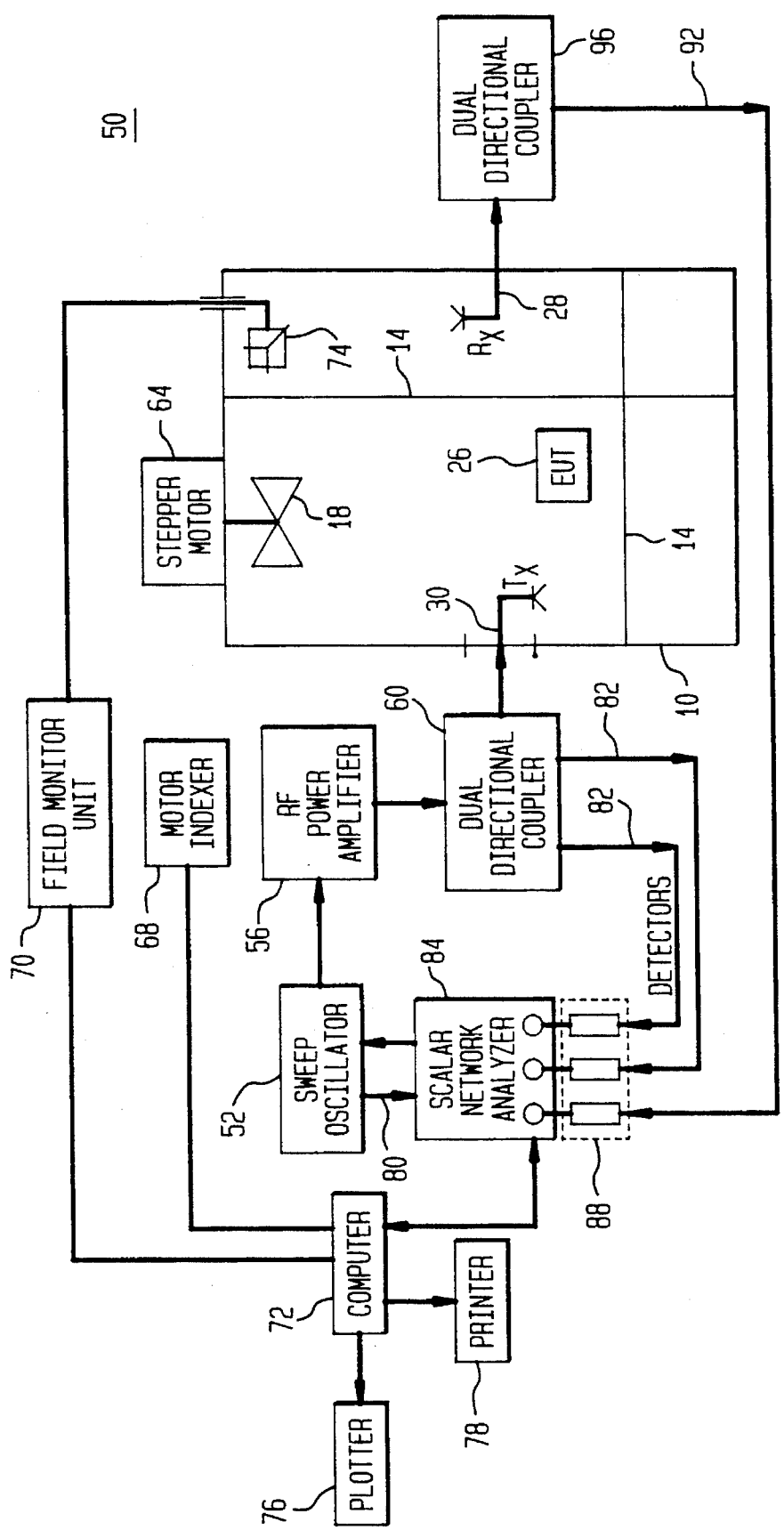
FIG. 2 is a functional schematic block diagram of a subharmonic frequency instrumentation system including the subharmonic frequency test chamber of FIG. 1.

In the drawings, like numerals are used to indicate like elements throughout. Referring now to FIGS. 1A, B, there are shown a subharmonic frequency test chamber 10 in accordance with a preferred embodiment of the present invention for applying electromagnetic fields to the electrical equipment under test 26 and a preferred subharmonic frequency instrumentation system 50, including the subharmonic frequency test chamber 10. The subharmonic frequency test chamber 10 is a mode stirred test chamber having a paddle wheel tuner 18 suspended from the roof of the test chamber 10 by a rotating armature 22.

Additionally, at least one and preferably a plurality of metal reradiating rods 14 are disposed at spaced apart locations within the subharmonic frequency test chamber 10. The elongated rods 14 may be disposed both parallel to each other and orthogonal to each other. In the preferred embodiment of the subharmonic frequency test chamber 10, at least four reradiating rods 14 are provided. Two reradiating rods 14 are disposed across the test chamber 10 substantially close to the paddle wheel tuner 18. Two more reradiating rods 14 are disposed across the test chamber 10 towards the bottom and towards the ends of the test chamber 10 so that they are substantially far from the paddle wheel tuner 18.

It will be understood that arrangements other than two reradiating rods 14 close to the paddle wheel tuner 18 and two reradiating rods 14 substantially far away from the paddle wheel tuner 18 will still impose new boundary conditions and result in subharmonic resonance frequencies within test chamber 10. However, it is believed that disposing rods 14 in accordance with these guidelines produces higher amplitude responses at the subharmonic resonant frequencies. Reradiating rods 14 impose new boundary conditions upon the applied energy and cause the test chamber 10 to resonate at subharmonic frequencies $f_S$ which are lower than the fundamental frequency $f_0$ of the test chamber 10. Test chamber 10 applies gain to an input signal at the subharmonic frequency $f_S$.

In the preferred embodiment of the subharmonic test chamber 10 the reradiating rods 14 are removable. Their length may be conformed to the internal dimensions of the test chamber 10 thereby permitting them to be merely jammed in between opposing walls. A slight indentation of the walls formed by jamming reradiating rods 14 does not appear to to cause any problems. Teflon inserts (not shown) may be disposed between the ends of the rods 14 and the walls of the test chamber 10 in order to substantially electrically decouple one or two ends of the rods 14 from the walls of the test chamber 10. The convenient removal and replacement of the reradiating rods 10 facilitates the use of the test chamber 10 to function as either a conventional reverberating test chamber for performing measurements at operating frequencies above 200 MHz or a modified test chamber 10 to perform simulation of unwanted environmental radiation at a lower frequency.

In the preferred embodiment of subharmonic frequency test chamber 10, the reradiating rods 14 are formed of aluminum and are circular, with a diameter of approximately one-half inch. However, it will be understood that reradiating rods 14 of other configurations such as hollow and square may be also used. However, the differing self-inductance of hollow rods and square rods are believed to alter the Q of subharmonic resonance frequency test chamber 10. Aluminum is used to form the reradiating rods 14 because aluminum has substantially the same permeability as free space. Other materials such as steel as well as tungsten coated steel reradiating rods 14 may be used within subharmonic resonant frequency test chamber 10 although the differing permeabilities of these materials may alter how lossy the current paths through them are.

When the subharmonic frequency test chamber 10 is operated as a conventional mode stirred chamber for frequencies above 200 MHz it may generate a multi-moded electromagnetic environment. In this frequency range the mode stirred test chamber 10 provides a statistically averaged characteristic wave impedance which approximates that of plane wave impedance, three hundred seventy-seven ohms. The fields generated in the test chamber 10 are homogeneous and isotropic. Thus the equipment under test 26 may be placed anywhere in the test volume and receive fields from all directions. Since the fields inside the test chamber 10 are homogenous and isotropic the coupling of the fields onto the equipment under test 26 is more effective.

When the reradiating rods 14 are disposed within the test chamber 10 near field environments are generated at high frequencies. The characteristic wave impedance of the environment may vary from a few ohms to several thousand ohms. The modification of the subharmonic frequency test chamber 10 in this manner includes attaching at least one circular conducting reradiating rod 14 between opposing vertical walls or between the floor and ceiling of the test chamber 10. One or both of the ends of the reradiating rods 14 may be electrically isolated from the walls or electrically terminated to the walls of the subharmonic frequency test chamber 10 using teflon inserts as previously described. However, it will be understood by those skilled in the art that the rods 14 are still capacitively coupled to the walls.

It is believed that reradiating rods 14 provide current paths which are less lossy than the current paths which exist on the walls of the test chamber 10. These currents on the surface of the reradiating rods 14 cause electrical fields to reradiate from the rods 14. This reradiation establishes inductive fields or radiative fields depending on whether the electrical equipment under test 26 is inside or outside of the near field/far field transition region of the reradiating rods 14.

The mixing of wave impedance within subharmonic frequency test chamber 10 may be accomplished in four ways: 1) rotation of the paddle-wheel tuner 18 in a manner well known in the field of prior art mode stirred test chambers, 2) reorientation of the reradiating rods 14, 3) varying the distance between the reradiating rods 14 and the electrical equipment under test 26, and 4) varying the distance between the reradiating rods 14 and the paddle wheel tuner 18.

In the preferred embodiment the test chamber 10 is constructed with continuously welded aluminum panels. The metallic paddle wheel tuner 18 is disposed at the center of the chamber ceiling. The paddle wheel tuner 18 is rotated by a stepper motor 64 under the control of a motor indexer 68 and a computer 72. Preferably the equipment under test 26 is placed at the center of the test chamber 10, a few feet above the floor. The equipment under test 26 should be electrically isolated from the test chamber 10.

In the preferred embodiment the test chamber 10 may comprise an aluminum enclosure 5.8 m long×4.57 m wide× 2.37 m high. It should provide 110 dB of attenuation from 14 kHz to 10 GHz and have a Q-factor over 100,000 for frequencies above 800 MHz. The test chamber 10 may be excited using a long-wire antenna 30 in the 30 MHz to 1.0 GHz range and double ridged horns (not shown) in the 1.0 GHz to 40 GHz range when performing conventional mode-stirred testing. A field monitoring probe 74 should be placed close to the electrical equipment under test 26. The response of the equipment under test 26 may be monitored by cables which are routed through conventional access panels within test chamber 10.

Subharmonic frequency instrumentation system 50 includes a sweep oscillator frequency synthesizer 52 for providing a test frequency source signal. The source signal from sweep oscillator 52 is amplified using a radio frequency power amplifier 56 and routed through a dual directional coupler 60 to the transmitting antenna 30 in the interior of the subharmonic frequency test chamber 10. The test chamber 10 is thus excited at the source signal frequency by the input energy applied by way of the transmitting antenna 30. In a preferred embodiment of the subharmonic frequency test chamber 10, the transmitting antenna 30 may be disposed at a location within the test chamber 10 opposite to the reference receiving antenna 28. The antennas 28, 30 may also be biconical antennas or plate antennas.

The incident and reflected power from the subharmonic frequency test chamber 10 are sampled from the dual directional couplers 60 by a scalar network analyzer 84 using lines 82. The response received by the reference receiving antenna 28 is also sampled by the scaler network analyzer 84. This sampling is performed by way of dual directional coupler 96 and line 92. The testing response data from scalar network analyzer 84 and the data from electric and magnetic field probe meters 74 and field monitor unit 70 are recorded by a computer 72. In order to determine the effective operation of the reradiating rods 14, the ratio of average received power with and without the reradiating rods 14 may be determined by the computer 72. Additionally the increase in modal density and field uniformity within a unit volume for a particular band of frequencies may be examined. Information from the computer 72 may be displayed using a plotter 76 or a printer 78.

Figure 3A:
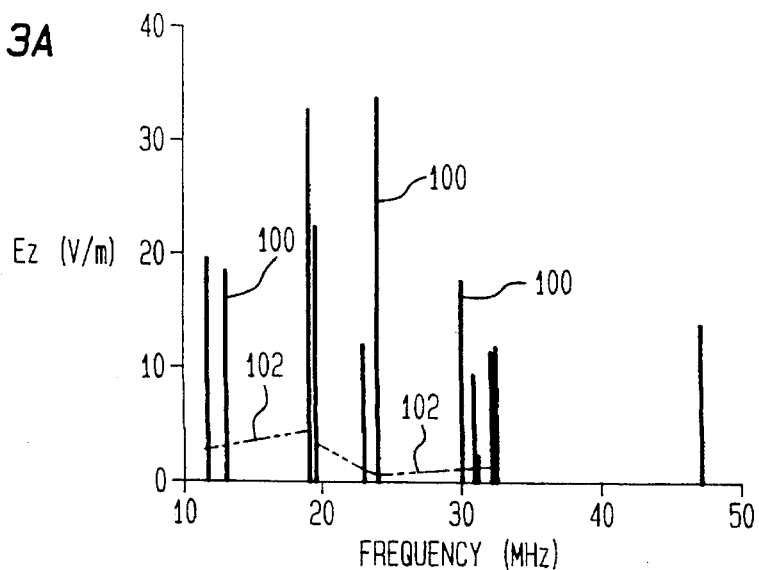
FIGS. 3A–C are graphical representations of a comparison between the maximum x, y and z components of an electrical field within the subharmonic frequency test chamber of FIG. 1 with and without rods disposed within the test chamber.
Figure 3B:
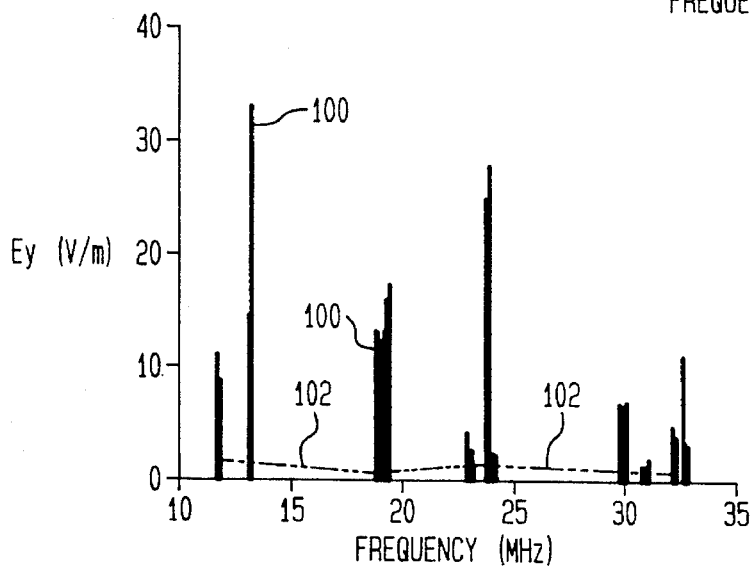
Figure 3C:
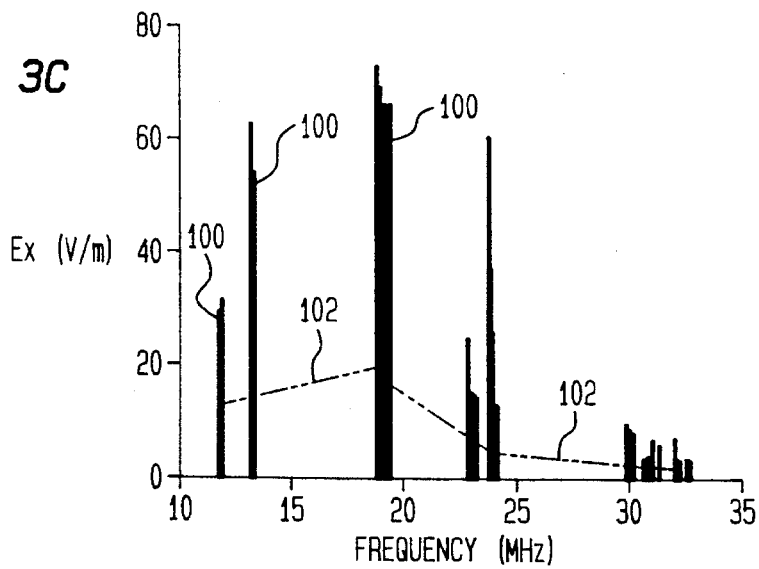

Referring now to FIGS. 3A, B,C, there are shown graphical representations 100, 102 of the maximum electric field components within subharmonic frequency test chamber 10. These field components are graphically represented both for the case wherein the reradiating rods 14 are disposed within the test chamber 10 and the case wherein the reradiating rods 14 are not disposed within the test chamber 10. They are illustrated for the x, y and z components.

In each component, the spikes 100 represent the maximum electric field components when the reradiating rods 14 are disposed within the subharmonic frequency test chamber 10. The corresponding maximum fields when the reradiating rods 14 are not disposed within the test chamber 10 are illustrated as waveforms 102. It will be understood by those skilled in the art that spikes 100 at frequencies between 10 MHz and 35 MHz represent subharmonic resonant frequencies within the test chamber 10 notwithstanding the relatively small size of the test chamber 10. It will also be noted that, while each spike of a plurality of spikes 100 in the vicinity of a subharmonic frequency receives some gain from the test chamber 10, a peak gain is applied at the subharmonic frequency. This is true in the vicinity of each subharmonic frequency of the plurality of subharmonic frequencies shown in the drawing.

Figure 4:
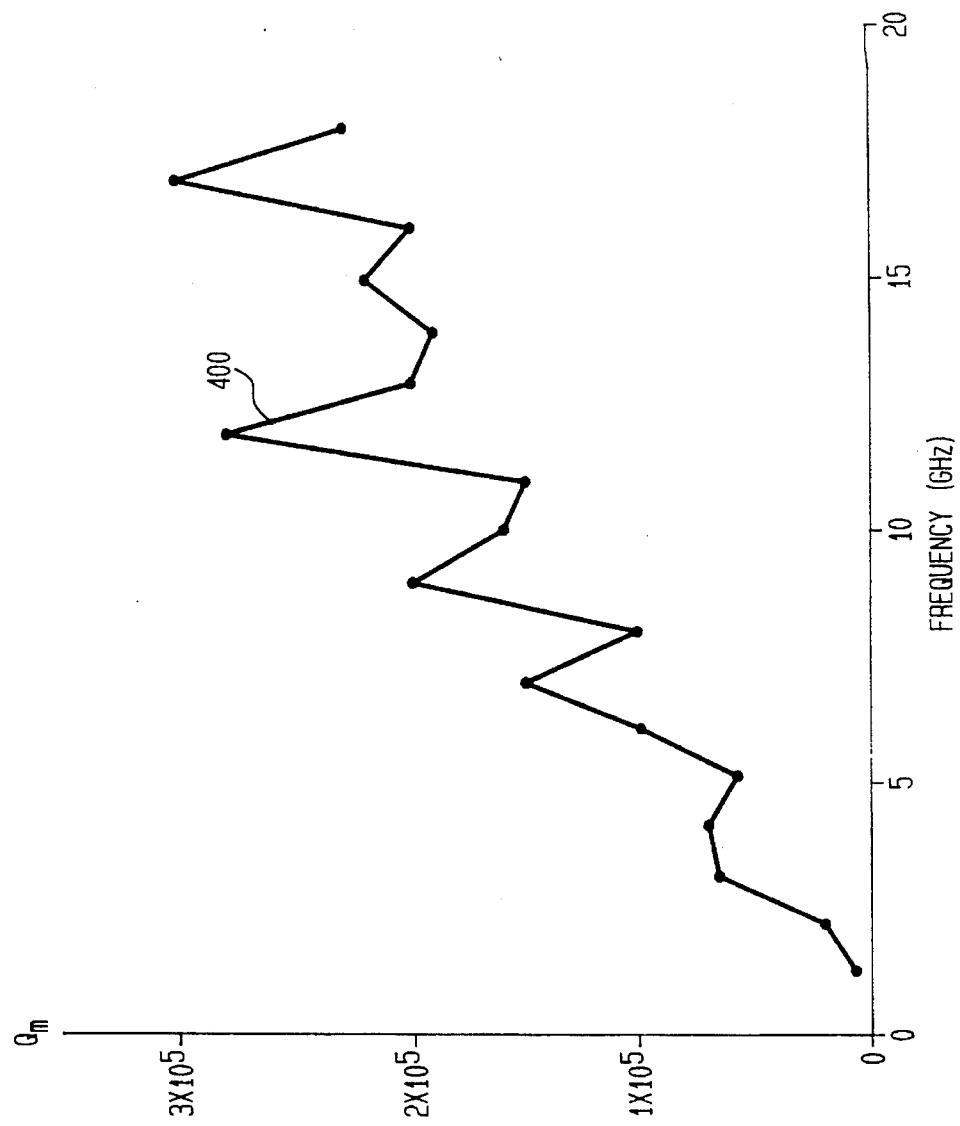
FIG. 4 is a graphic representation of the measured Q for the subharmonic frequency test chamber of FIG. 1 when the chamber is empty.
Figure 5:
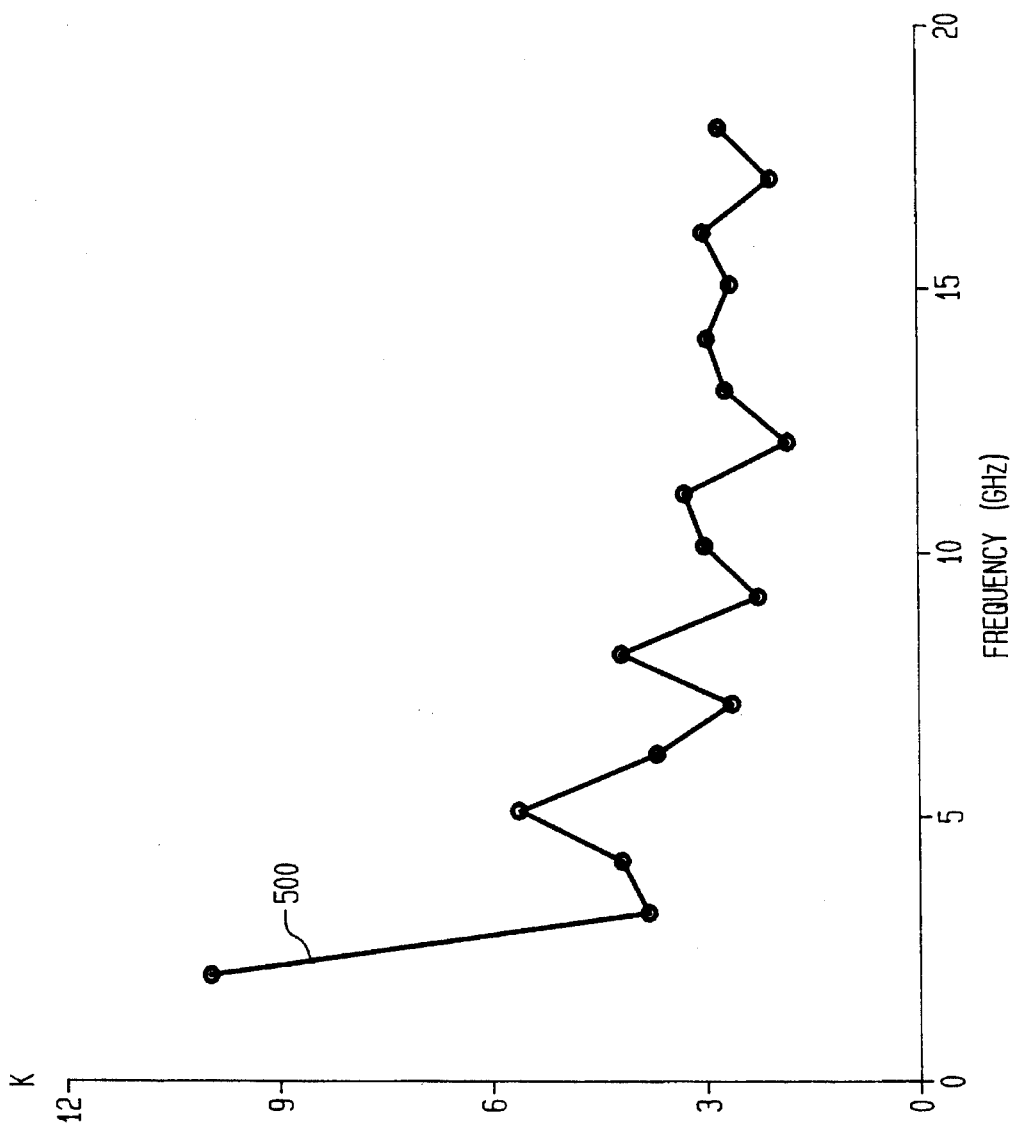
FIG. 5 is a graphical representation of the ratio of the composite Q and the experimental $Q_m$ for the subharmonic frequency test chamber of FIG. 1.

Referring now to FIGS. 4, 5 there are shown graphical representations 400, 500. The graphical representation 400 or waveform 400 indicates the measured Q of the subharmonic frequency test chamber 10 when no rods are in the subharmonic frequency test chamber 10. The graphical representation 500 or waveform 500 indicates the ratio K wherein K is understood to represent the ratio of the theoretical composite Q to the experimentally measured $Q_m$ of waveform 400. This is the ratio of the empirical $Q_m$ to the theoretical Q of the test chamber 10.

The measured Q for subharmonic frequency test chamber 10, as shown in graphical representation 400, is given by:

$$Q_m = \frac{16\pi^2 V}{\lambda^3} \frac{P_r}{P_t}$$

where V is the voltage, $P_r$ is the power received by test chamber 10 at receiving antenna 28, is the wavelength and and $P_t$ is the power transmitted using transmitting antenna 30.

The theoretical explanation of the subharmonic resonant frequencies of test chamber 10 may be set forth as follows. Assume that the subharmonic frequency test chamber 10 has three dimensions a, b and d. Represent the fundamental frequencies in the x, y and z directions as $f_0^{(a)}$, $F_0^{(b)}$ $f_0^{(d)}$. Such a subharmonic frequency test chamber 10 has three resonant frequencies:

$$f_s^{(a)} = \frac{f_0^{(a)}}{n}$$

$$f_s^{(b)} = \frac{f_0^{(b)}}{m}$$

$$f_s^{(d)} = \frac{f_0^{(d)}}{l}$$

where $f_s^{(a)}$, $f_s^{(b)}$ $f_s^{(d)}$ and $f_s^{(d)}$ are subharmonic frequencies in the dimensions having the lengths, a, b and d, respectively, and n, m and l are integers greater than one.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. An electromagnetic field test chamber system having chamber walls and a chamber impedance for performing tests in a region having electromagnetic fields external to said chamber, comprising:

an electromagnetical shield for substantially preventing said external electromagnetic fields from being applied to the interior of said chamber;

a first antenna for applying predetermined electromagnetic energy to the interior of said chamber;

a tuner for modifying said chamber impedance;

at least one rod having rod ends wherein said rod ends are disposed against different chamber walls and electrically coupled to said different chamber walls for establishing boundary conditions for said applied electromagnetic energy within said chamber; and a second antenna for receiving said applied electromagnetic energy.

2. The electromagnetic field test chamber of claim 1, wherein said at least one rod comprises an elongated circular rod.

3. The electromagnetic field test chamber of claim 1, wherein said rod comprises a rod adapted to be disposed at differing locations within said chamber.

4. The electromagnetic field test chamber of claim 1, wherein said at least one rod further comprises a plurality of said rods.

5. The electromagnetic field test chamber of claim 4, wherein two rods of said plurality of rods are orthogonal to each other.

6. The electromagnetic field test chamber of claim 1, wherein said first and second antennas comprise biconical antennas.

7. The electromagnetic field test chamber of claim 1, where said tuner comprises a metallic tuner having a motor for moving said tuner.

8. The electromagnetic field test chamber of claim 1, further comprising a signal source and an amplifier external to said chamber and coupled to said chamber for applying energy to said first antenna.

9. A method for transmitting input energy in a chamber to provide output energy, said chamber having a predetermined fundamental frequency $f_0$ determined at least in part by the dimensions of said chamber, comprising the steps of:

(a) applying said input energy to said chamber at a frequency equal to a subharmonic frequency $f_s=f_0/n$ where n is an integer greater than 1;

(b) applying said input energy to said chamber at a first plurality of neighboring frequencies in the vicinity of said subharmonic frequency $f_s$;

(c) transmitting said applied input energy at said subharmonic frequency $f_s$ and at said neighboring frequencies by said chamber wherein energy transmitted at said subharmonic frequency $f_s$ is transmitted by said chamber at a higher efficiency than energy transmitted at said neighboring frequencies to provide a peak chamber power density at said subharmonic frequency $f_s$; and (d) receiving said peak chamber power density.

10. The method of transmitting input energy of claim 9, comprising the step of disposing at least one rod within said chamber to thereby determine said subharmonic frequency $f_s$.

11. The method of transmitting input energy of claim 10, wherein the step of disposing said at least one rod within said chamber comprises the step of disposing a plurality of rods within said chamber.

12. The method of transmitting input energy of claim 11, wherein two rods of said plurality of rods are orthogonal to each other.

13. The method of transmitting input energy of claim 10, comprising the further step of adjusting the value of said transmission efficiency by adjusting said at least one rod.

14. The method of transmitting input energy of claim 13, wherein the step of adjusting said at least one rod comprises adjusting the position of said at least one rod within said chamber.

15. The method of transmitting input energy of claim 13, wherein the step of adjusting said at least one rod comprises the step of coupling one end of said at least one rod to a wall of said chamber.

16. The method of transmitting input energy of claim 15, comprising the step of electrically coupling two ends of said at least one rod to respective walls of said chamber.

17. The method of transmitting input energy of claim 10, comprising the further step of electrically coupling said at least one rod to said chamber.

18. The method of transmitting input energy of claim 17, wherein said at least one rod is electrically coupled to opposing walls of said chamber.

19. The method of transmitting input energy of claim 9, comprising the step of disposing an object to be tested within said chamber for testing said object, wherein testing of said object requires input energy having a test frequency $f_t$ wherein $f_t<f_0$.

20. The method of transmitting input energy of claim 9, comprising the further steps of:

(e) applying said input energy at a first plurality of subharmonic frequencies $f_s$ wherein each subharmonic frequency $f_s$ of said first plurality of subharmonic frequencies $f_s$ corresponds to a different value of n;

(f) applying said input energy to said chamber at a second plurality of input frequencies, said second plurality of input frequencies being in the vicinity of each of said subharmonic frequencies $f_s$; and (g) transmitting said input energy at each of said subharmonic frequencies $f_s$ and at said second plurality of input frequencies in the vicinity of said subharmonic frequencies $f_s$ by said chamber to provide a chamber power density wherein each of said subharmonic frequencies of $f_s$ is transmitted by said chamber at a higher efficiency than the frequencies in its vicinity to provide a plurality of peak chamber power density responses wherein each peak power density response occurs at a subharmonic frequency $f_s$.

21. The method of transmitting input energy of claim 9, comprising the step of disposing at least one rod in said chamber and electrically coupling both ends of said at least one rod to said chamber.

22. A method for tuning a resonant frequency of an electromagnetic field chamber having chamber walls and input and output antennas, comprising the steps of:

(a) disposing at least one rod having rod ends within said chamber in the vicinity of at least one of said antennas to determine said resonant frequency of said chamber wherein said rod ends are disposed against different chamber walls;

(b) electrically coupling the ends of said at least one rod to said different chamber walls; and (c) adjusting said at least one rod to thereby adjust said determined resonant frequency of said chamber.

23. The method for tuning a resonant frequency of claim 22, wherein the disposing of step (a) comprises the step of coupling said at least one rod to opposing walls of said chamber.

24. The method for tuning a resonant frequency of claim 22, wherein the step of adjusting said at least one rod comprises the step of adjusting the position of said at least one rod within said chamber.

25. The method for tuning a resonant frequency of claim 22, whenever said at least one rod comprises a plurality of rods.

26. The method for tuning a resonant frequency of claim 22, wherein said test chamber has a fundamental frequency and said resonant frequency is less than said fundamental frequency.

27. The method for tuning a resonant frequency of claim 22, wherein said test chamber includes a movable tuner, comprising the further step of adjusting the impedance of said test chamber by moving said moveable tuner.

28. The method for tuning a resonant frequency of claim 22, wherein an input signal is applied to said test chamber by way of said input antenna comprising the further step of adjusting the efficiency of transmission of said input signal by said test chamber by adjusting said rod.

29. The method for tuning a resonant frequency of an electromagnetic field chamber of claim 22, wherein step (b) comprises the step of electrically coupling the ends of said at least one rod to opposing walls of said chamber.

* * * * *